(12) United States Patent
Chen (10) Patent No.: US 8,071,998 B2
(45) Date of Patent: Dec. 6, 2011

(54) LIGHT EMITTING ASSEMBLY

(75) Inventor: Kuei-Fang Chen, Hsinchu (TW)

(73) Assignee: Kuei-Fang Chen (TW)

( * ) Notice: Subject to any disclaimer, the term of this patent is extended or adjusted under 35 U.S.C. 154(b) by 241 days.

(21) Appl. No.: 12/325,661

(22) Filed: Dec. 1, 2008

(65) Prior Publication Data
US 2009/0159905 A1    Jun. 25, 2009

(30) Foreign Application Priority Data

Dec. 24, 2007    (TW) ................................ 96149712 A (51) Int. Cl.
*H01L 33/00*      (2010.01)
(52) U.S. Cl. ................ 257/99; 257/88; 257/98
(58) Field of Classification Search ............ 257/88, 257/98–99, E33.075
See application file for complete search history.

(56) References Cited

U.S. PATENT DOCUMENTS

| | | | |
|---|---|---|---|
| 6,274,924 B1 | 8/2001 | Carey et al. | |
| 6,936,855 B1 * | 8/2005 | Harrah | 257/88 |
| 7,098,483 B2 * | 8/2006 | Mazzochette et al. | 257/81 |
| 7,264,378 B2 * | 9/2007 | Loh | 362/294 |
| 7,631,986 B2 * | 12/2009 | Harrah | 362/230 |
| 7,795,051 B2 * | 9/2010 | Elpedes et al. | 438/25 |
| 2004/0140543 A1 * | 7/2004 | Elpedes et al. | 257/676 |
| 2005/0024834 A1 | 2/2005 | Newby | |
| 2005/0078447 A1 | 4/2005 | Hamann et al. | |
| 2005/0274959 A1 * | 12/2005 | Kim et al. | 257/79 |
| 2006/0043401 A1 * | 3/2006 | Lee et al. | 257/99 |
| 2007/0201232 A1 | 8/2007 | Chen | |
| 2008/0013320 A1 | 1/2008 | Tain et al. | |
| 2008/0087911 A1 * | 4/2008 | Stoyan | 257/99 |
| 2009/0278162 A1 * | 11/2009 | Wang et al. | 257/99 |
| 2009/0284932 A1 * | 11/2009 | Lin | 361/718 |
| 2010/0193830 A1 * | 8/2010 | Lin et al. | 257/99 |
| 2011/0101410 A1 * | 5/2011 | Lin et al. | 257/99 |

FOREIGN PATENT DOCUMENTS

| | | |
|---|---|---|
| DE | 102006034425 A1 | 2/2007 |
| TW | I220467 | 8/2004 |
| TW | M308505 | 3/2007 |
| TW | M311119 | 5/2007 |
| TW | M311844 | 5/2007 |

* cited by examiner

*Primary Examiner* — Allan R Wilson
(74) *Attorney, Agent, or Firm* — Grossman Tucker Perreault & Pfleger PLLC (57) ABSTRACT

A light emitting assembly includes: a heat sink having a base wall and at least one mesa protruding from the base wall; and at least one light emitting package unit having at least one light emitting package bonded to the mesa so as to transfer heat generated from the light emitting package to the base wall through the mesa. A circuit board includes a substrate that is formed with at least one through-hole, and is provided with a conductive contact unit that is formed on the substrate. The heat sink is attached to the substrate such that the mesa protrudes from the base wall into and through the through-hole in the substrate so as to be bonded to the light emitting package.

15 Claims, 8 Drawing Sheets

LIGHT EMITTING ASSEMBLY

CROSS-REFERENCE TO RELATED APPLICATION

This application claims priority of Taiwanese Application No. 096149712, filed on Dec. 24, 2007.

BACKGROUND OF THE INVENTION

1. Field of the Invention

The invention relates to a light emitting assembly, more particularly to a light emitting assembly including a light emitting package and a heat sink having a mesa protruding therefrom through a circuit board to be bonded to the light emitting package.

2. Description of the Related Art

Figure 1:
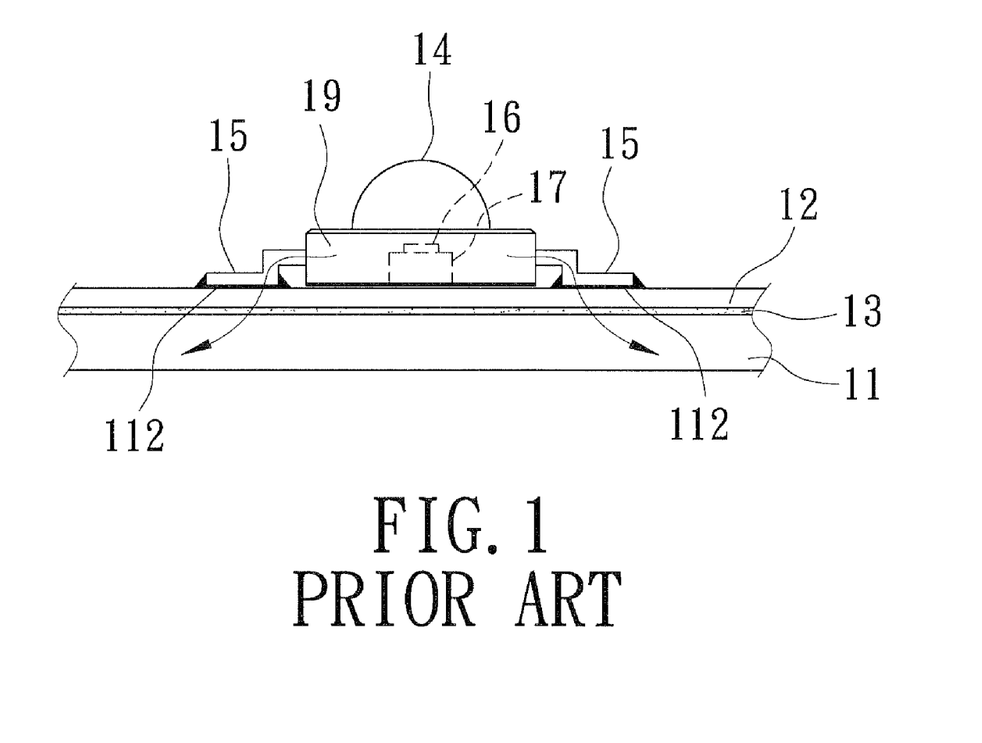
FIG. 1 is a fragmentary schematic view of a conventional heat-sink slug LED package.
Figure 2:
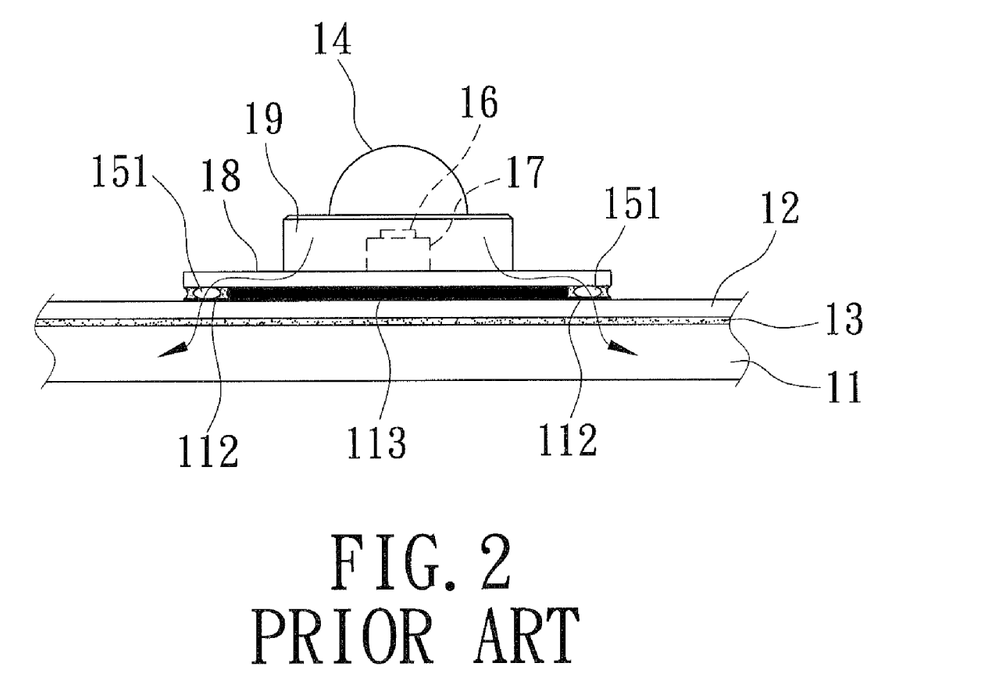
FIG. 2 is a fragmentary schematic view of a conventional SMD ceramic LED package.

Development of light emitting diode (LED) packages in the LED industry since 1970 to the present day can be divided into successive generations in terms of thermal resistance. The LED packages from the early generation to the latest generation include 5 mm LED package, Low Profile LED package, Low Profile with extended lead frame LED package, Heat-sink Slug LED package (see FIG. 1), and SMD (Surface Mount Device) Ceramic LED package (see FIG. 2), which have thermal resistances of 250 K/W, 125 K/W, 75 K/W, 15 K/W, and 6 K/W, respectively. Early developed LED packages have a relatively low brightness and are normally used in applications, such as indicators in personal computers, electronic devices, and the like. These LED packages have characteristics of low power consumption and low heat generation. In the indicator applications, since the heat generated by the LED packages is relatively small and since their installed quantity in a unit area is small, they are allowed to be mounted directly on a printed circuit board (which serves as a power connecting medium to permit power to be transmitted to the LED packages mounted thereon) without considering how the heat generated by the LED packages can be dissipated. However, when the LED packages are to be used in illuminating applications, such as vehicle headlights and projector lamps, they are required to be high power LED packages and to have a high density so as to achieve a high luminance and brightness, which results in high heat generation. As such, the heat generated by the high power LED packages cannot be neglected, and the heat dissipating issue becomes relatively important to the service life of the high power LED packages. As illustrated in FIG. 1, the aforementioned heat-sink slug LED package (a non-surface mountable device) normally includes a light emitting die 16 enclosed by a dome-shaped encapsulant 14, a molding material 19 molded over leadframe leads 15 of the light emitting die 16, and a heat-sink slug 17 of a thermally conductive material embedded in the molding material 19 and bonded to the light emitting die 16 for enhancing heat dissipation. U.S. Pat. No. 6,274,924 discloses a heat-sink slug LED package of this type. Referring further to FIG. 2, the aforementioned SMD ceramic LED package differs from the heat-sink slug LED package in that the former further includes a ceramic layer 18 bonded to the heat-sink slug 17 for permitting the LED package to be surface mountable and for enhancing heat dissipation. Although the LED packages of FIG. 1 and FIG. 2 have an improved heat dissipation, the heat dissipation issue is still a major problem for these LED packages when used in illuminating applications, particularly for applications, such as vehicle headlights and projectors, that require a high density of the LED packages and that can provide light focusing function. Since the LED packages to be used for illuminating applications are high power LED packages, fast transfer of the heat generated by the high power LED packages to the outside environment is crucial. As such, mounting of the high power LED packages directly on the printed circuit board in a conventional manner as those of the low power LED packages is not feasible due to the thermal insulating property of the dielectric substrate of the printed circuit board, which is made from an insulating material, such as phenolic cotton paper, and which is a thermal barrier for transferring the heat from the LED packages to the outside environment. In order to solve this problem, metal core PCBs have been developed in recent years to replace the conventional printed circuit board for serving as a power connecting medium for the high power LED packages mounted thereon as well as to act as a heat sink to dissipate heat from the LED packages which the conventional printed circuit board fails to provide. Referring back to FIGS. 1 and 2, the metal core PCB includes an anodized aluminum substrate 11 with an anodized surface 13, an insulator layer 12 formed on the anodized surface 13 of the aluminum substrate 11, and conductive traces 112 formed on the insulator layer 12. When the LED packages of FIG. 1 are mounted on the metal core PCB, the leadframe leads 15 are bonded to the conductive traces 112, and the heat-sink slug 17 is bonded to the insulator layer 12 through a thermally conductive adhesive so as to transfer heat from the LED package to the outside environment through the aluminum substrate 11. When the LED packages of FIG. 2 are mounted on the metal core PCB, solder bumps 151 on the ceramic layer 18 are bonded to the conductive traces 112, and the ceramic layer 18 is bonded to the insulator layer 12 through a thermally conductive adhesive 113 so as to transfer heat from the LED package to the outside environment through the aluminum substrate 11. Note that since the standard requirement of the voltage resistance for a substrate on which the LED packages are to be mounted is 2.5 kV and since the voltage resistance of the anodized surface 13 of the aluminum substrate 11 is about 220 to 400V, the insulator layer 12 on the aluminum substrate 11 is required so as to meet the requirement. Although the aluminum substrate 11 has a heat conduction coefficient of 225 w/mk, the insulator layer 12 is made from an epoxy material and the heat conduction coefficient of the insulator layer 12 is relatively low. As a consequence, the heat dissipation rate of the metal core PCB is considerably and adversely affected by the presence of the insulator layer 12, and is still insufficient to permit use of the LED packages in high brightness and/or high light focusing (which means a high density of LED packages) illuminating applications. Current solutions to the heat dissipating problem of the LED packages in the illuminating applications are focused on how to improve the heat dissipation of the metal core PCB. However, the heat dissipation rate of the metal core PCB is considerably limited by the insulating layer 12.

SUMMARY OF THE INVENTION

Therefore, the object of the present invention is to provide a light emitting assembly that can overcome the aforesaid drawbacks of the prior art.

According to this invention, there is provided a light emitting assembly that comprises: a heat sink having a base wall and at least one mesa protruding from the base wall; and at least one light emitting package unit having at least one light emitting package bonded to the mesa so as to transfer heat generated from the light emitting package to the base wall through the mesa.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail with reference to the accompanying preferred embodiments, it should be noted herein that like elements are denoted by the same reference numerals throughout the disclosure.

Figure 3:
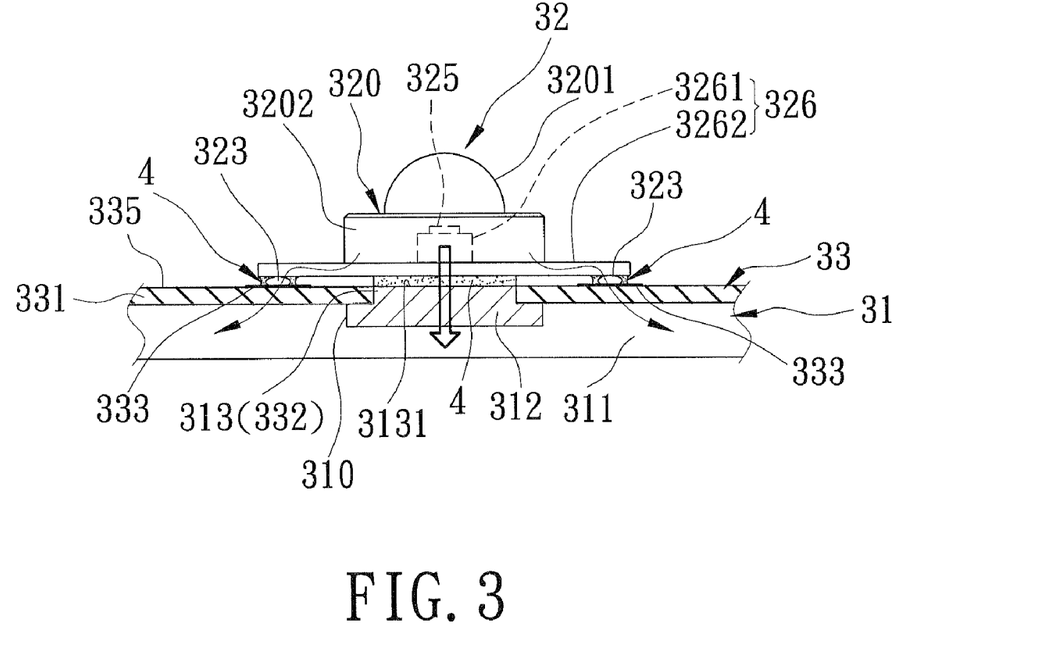
FIG. 3 is a fragmentary partly sectional view of the first preferred embodiment of a light emitting assembly according to this invention.
Figure 4:
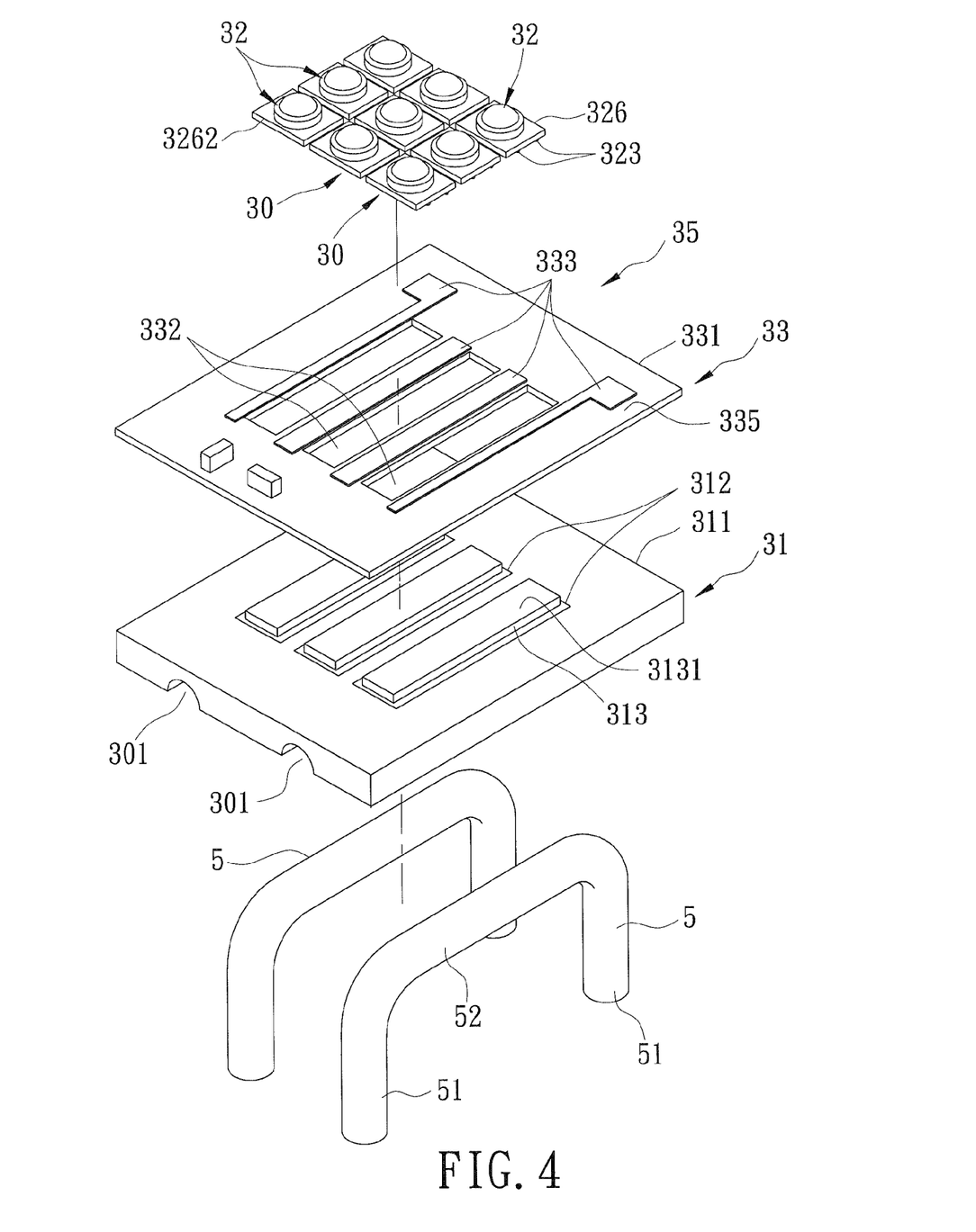
FIG. 4 is an exploded perspective view of the first preferred embodiment.
Figure 5:
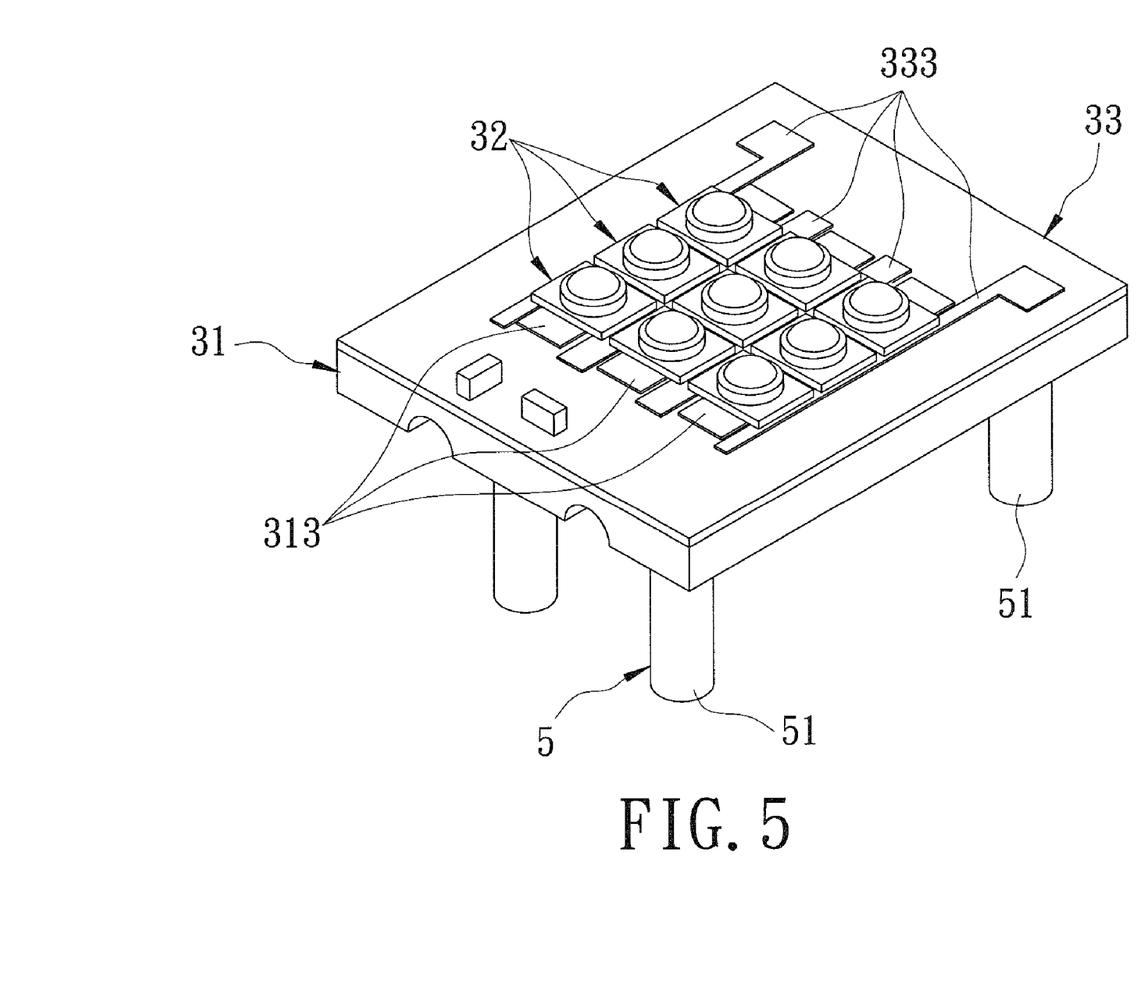
FIG. 5 is an assembled perspective view of the first preferred embodiment.

FIGS. 3 to 5 illustrate the first preferred embodiment of a light emitting assembly according to the present invention. The light emitting assembly includes: a heat sink 31 having a plate-like base wall 311 of a first metallic material and at least one mesa 313 (three mesas 313 are formed in this embodiment) of a second metallic material protruding from the base wall 311; and at least one light emitting package unit 30 (three light emitting package units 30 are included in this embodiment) including a plurality of light emitting packages 32 bonded to the mesa 313 of the heat sink 31 so as to transfer heat generated from the light emitting packages 32 to the base wall 311 through the mesa 313.

The light emitting assembly further includes a circuit board 33. The circuit board 33 may be a conventional printed circuit board having a dielectric substrate of an insulator material, such as a phenolic based material, or a metal core printed circuit board having an anodized substrate of a metal, such as aluminum. In this embodiment, the circuit board 33 includes a substrate 331 that is formed with at least one through-hole 332 (three elongate through-holes 332 are formed in this embodiment), and provided with a conductive contact unit 35 that is formed on the substrate 331. The heat sink 31 is attached to the substrate 331 such that the mesa 313 protrudes from the base wall 311 into and through the through-hole 332 in the substrate 331 so as to be bonded to the light emitting package unit 30. Preferably, the substrate 331 is a dielectric substrate of phenolic cotton paper so as to meet the standard requirement for the voltage resistance, i.e., greater than 2.5 kV, of the substrate for mounting of the LED packages thereon.

Each of the light emitting packages 32 includes a light emitting die 325 coupled to the conductive contact unit 35, an enclosing wall 320 that encloses the light emitting die 325, and a heat dissipating member 326 that is bonded to the mesa 313 and that includes a heat-sink slug 3261 embedded in the enclosing wall 320 and connected to the light emitting die 325 in a manner to conduct heat from the light emitting die 325 to the mesa 313 of the heat sink 31.

For the sake of brevity, only one through-hole 332, one mesa 313 and one light emitting package unit 30 will be discussed in the following paragraphs.

In this embodiment, each of the light emitting packages 32 is in the form of a Surface Mount Device (SMD). The heat dissipating member 326 is welded to the mesa 313 of the heat sink 31 using a solder material 4 through a solder reflowing techniques. The heat-sink slug 3261 is preferably made from one of copper, aluminum, and ceramic materials. In this embodiment, the heat-sink slug 3261 is made from copper. The solder material 4 is preferably a tin solder ball. The tin solder ball is subjected to a reflowing process after application to the heat-sink slug 3261.

The base wall 311 of the heat sink 31 is formed with a retaining recess 310. The heat sink 31 further has an insert 312 embedded in the retaining recess 310. The mesa 313 is integrally formed with the insert 312 into a single piece.

In this embodiment, the enclosing wall 320 includes a transparent dome-shaped portion 3201 covering the light emitting die 325, and a molded plastic portion 3202 extending and enlarged in size from the dome-shaped portion 3201. The heat-sink slug 3261 is embedded in the molded plastic portion 3201 of the enclosing wall 320. The heat dissipating member 326 further includes a ceramic layer 3262 disposed between and bonded to the heat-sink slug 3261 and the mesa 313 of the heat sink 31. Preferably, the ceramic layer 3262 is made from silicon carbide. Each of the light emitting packages 32 further includes a pair of conductive bodies 323 (which are in the form of conductive bumps) formed on a bottom of the ceramic layer 3262 and connected to leadframe leads (not shown) of the respective one of the light emitting packages 32. The leadframe leads are enclosed in the enclosing wall 320.

The substrate 331 has an insulator trace-forming surface 335. The conductive contact unit 35 includes a pair of conductive contacts 333 (in this embodiment, two pairs of the conductive contacts 333 are provided, but only one pair is illustrated for the sake of brevity) that are printed on the trace-forming surface 335 at two opposite sides of a periphery of the through-hole 332 and that are bonded respectively to the conductive bodies 323 of each of the light emitting packages 32 through the solder material 4. The solder material 4 used is preferably tin solder ball. The tin solder ball is subjected to a reflowing process after application to the conductive contacts 333. The mesa 313 of the heat sink 31 has an end face 3131 that is substantially flush with the trace-forming surface 335 of the substrate 331. The ceramic layer 3262 of the heat dissipating member 326 is bonded to the end face 3131 of the mesa 313 through the solder material 4.

In this embodiment, the base wall 311 is made from aluminum. The mesa 313 and the insert 312 are made from one of copper and aluminum so that an eutectic alloy of tin-copper is formed at the boundary between the mesa 313 and the solder material 4 during welding of the heat dissipating member 326 to the mesa 313 through the solder material 4 when the mesa 313 is made from copper. When the mesa 313 is made from aluminum, the same is pre-treated and is then subjected to electroplating to form a nickel plating layer (not shown) thereon for bonding to the solder material 4. As such, a metal-to-ceramic connection is established between the heat sink 31 and the heat dissipating member 326 of each of the light emitting packages 32, thereby greatly enhancing heat dissipation of the light emitting packages 32.

In this embodiment, the light emitting assembly further includes at least one heat pipe 5 (two heat pipes 5 are included in this embodiment). The base wall 311 of the heat sink 31 is formed with at least one retaining groove 301 (two retaining grooves 301 are formed in this embodiment). Each of the heat pipes 5 is U-shaped, and has two end portions 51 and an embedded portion 52 that extends between the end portions 51 and that is embedded in a respective one of the retaining grooves 301 and that is cylindrical in shape so as to achieve a large contact surface area between the heat pipes 5 and the heat sink 31. The end portions 51 of each of the heat pipes 5 extend away from the base wall 311. With the inclusion of the heat pipes 5 in the light emitting assembly, the heat generated by the light emitting packages 32 can be transferred to the outside environment more efficiently. Preferably, each of the heat pipes 5 is formed with fins (not shown) thereon. The structure of the heat pipes 5 is well known in the art and will not be described herein for the sake of brevity.

Figure 6:
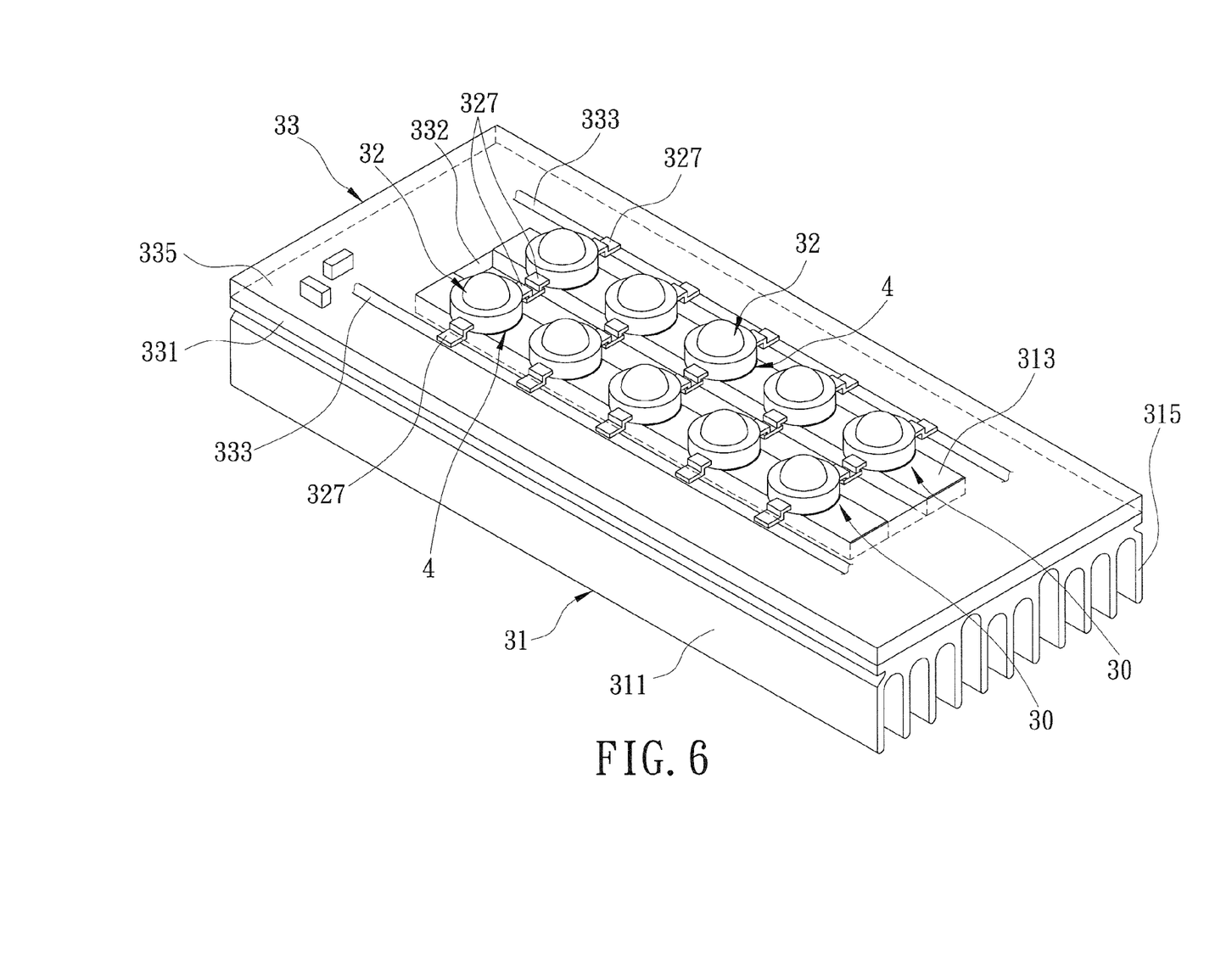
FIG. 6 is a perspective view of the second preferred embodiment of the light emitting assembly according to this invention.
Figure 7:
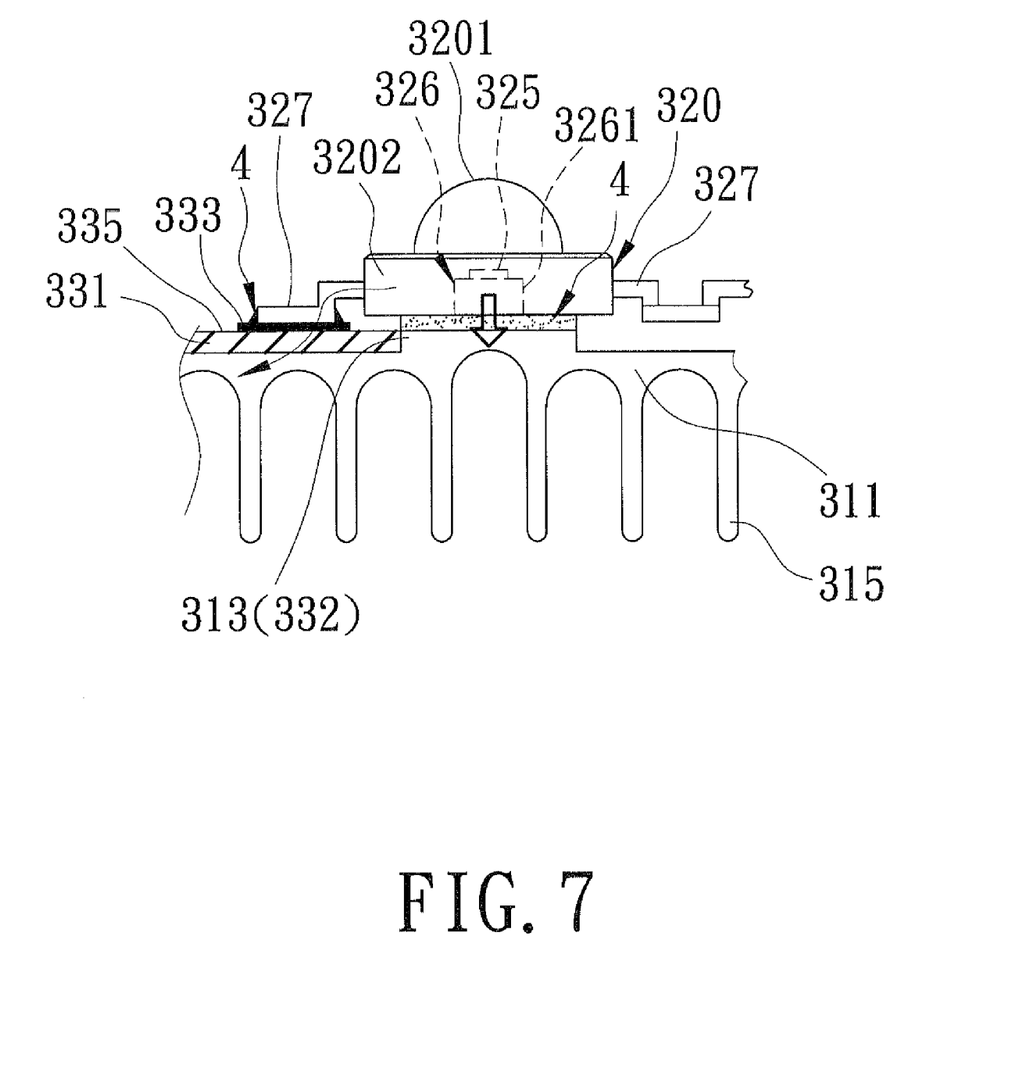
FIG. 7 is a fragmentary partly sectional view of the second preferred embodiment.

FIGS. 6 and 7 illustrate the second preferred embodiment of the light emitting assembly according to this invention. The second preferred embodiment differs from the previous embodiment mainly in that each of the light emitting packages 32 is in the form of a Heat-sink Slug LED package (with extended lead frame but without the ceramic layer 3262 of the previous embodiment) and that the base 311 is formed with a plurality of fins 315 (without the heat pipes 5 of the previous embodiment). In this embodiment, two of the light emitting package units 30 are respectively provided on a pair of the mesas 31 of the heat sink 31 which extend through the through-hole 332 in the substrate 331. The leadframe leads 327 of each of the light emitting packages 32 extend outwardly from the molded plastic portion 3202 of the enclosing wall 320. One of the leadframe leads 327 of each of the light emitting packages 32 of one of the light emitting package units 30 is bonded to a respective one of the conductive contacts 333 through the solder material 4, while the other of the leadframe leads 327 is connected to an adjacent one of the leadframe leads 327 of an adjacent one of the light emitting packages 32 of the other of the light emitting package units 30 through the solder material 4. In this embodiment, the heat-sink slug 3261 is made from copper and is bonded to the mesa 313 through the solder material 4. As such, a metal-to-metal connection between each of the light emitting packages 32 and the heat sink 31 is established.

Figure 8:
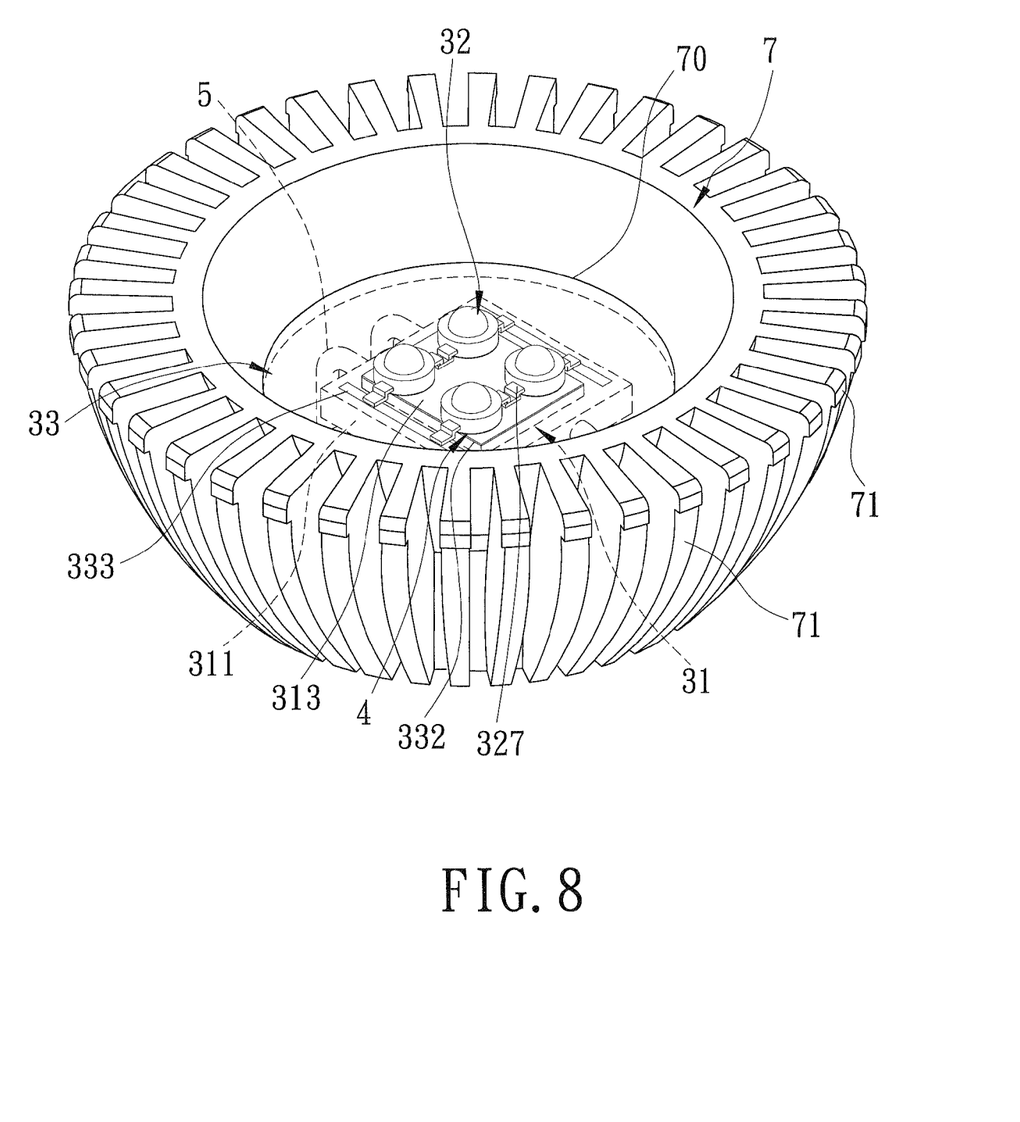
FIG. 8 is a perspective view of the third preferred embodiment of the light emitting assembly according to this invention.

FIG. 8 illustrates the third preferred embodiment of the light emitting assembly according to this invention. The third preferred embodiment differs from the previous preferred embodiments in that the light emitting assembly further includes a cup-shaped reflector 7 that has an end opening 70. The circuit board 35 is fitted securely into the end opening 70 to cover the latter. Each of the light emitting packages 32 is disposed in the reflector 7. A plurality of the heat pipes 5 are connected to the reflector 7 so as to conduct heat from the heat sink 31 to the reflector 7. In this embodiment, the reflector 7 has an outer wall formed with a plurality of fins 71. The light emitting assembly of the third preferred embodiment can be used as a headlight of a vehicle.

Experimental tests of the preferred embodiment and a conventional light emitting assembly using a metal core PCB as a heat sink show that the light emitting assembly of this invention is able to obtain a high density of the light emitting packages 32 per unit area such that a distance of about 1 cm (center to center) between two adjacent ones of the light emitting packages 32 of an array of the light emitting packages 32 is achieved, compared to a distance of about 2 cm for the conventional light emitting assembly. In the test of one embodiment, an array of four of the light emitting packages 32 were mounted on the heat sink 31 of the embodiment having a diameter of 3 cm (the center to center distance between two adjacent ones of the light emitting packages 32 is about 1 cm), and in the test of one conventional light emitting assembly, four of the light emitting packages 32 were mounted on a 3 cm×3 cm metal core PCB (the center to center distance between two adjacent ones of the light emitting packages 32 is about 1 cm). In both tests, an AC power of 14 W, which was converted into a DC power with a voltage of 7.4V and a current of 1.6 A, was applied to the test samples. The test results show that the test sample of the light emitting assembly of this invention can achieve a service life greater than 100 days (continuous application of the power to the test sample, i.e., running 24 hrs each day), while the test sample of the conventional light emitting assembly was burned out after about 10 hrs service.

With the formation of the mesa(s) 313 on the base wall 311 of the heat sink 31 of the light emitting assembly of this invention for establishing a metal-to-metal connection or a metal-to-ceramic connection between the heat sink 31 and each of the light emitting packages 32, the aforesaid drawbacks associated with the prior art can be eliminated.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A light emitting assembly comprising:
    a circuit board including a dielectric substrate that is formed with at least one elongate through-hole, and provided with a conductive contact unit that is formed on said dielectric substrate;
    a heat sink attached to said dielectric substrate and having a plate-like base wall of a first metallic material and at least one mesa of a second metallic material protruding from said base wall into and through said through-hole in said dielectric substrate; and
    at least one light emitting package unit including a plurality of light emitting packages bonded to said mesa and coupled to said conductive contact unit, each of said light emitting packages including a light emitting die and a heat dissipating member that is bonded to said mesa and that is connected to said light emitting die in a manner to conduct heat from said light emitting die to said mesa of said heat sink,
    wherein said dielectric substrate has a trace-forming surface, said mesa having an end face that is substantially flush with said trace-forming surface of said dielectric substrate.

2. The light emitting assembly of claim 1, further comprising a solder material, said heat dissipating member being welded to said mesa of said heat sink through said solder material.

3. The light emitting assembly of claim 2, wherein said solder material is a tin solder.

4. The light emitting assembly of claim 1, wherein said plate-like base wall of said heat sink is formed with a retaining recess, said heat sink further having an insert embedded in said retaining recess, said mesa being integrally formed with said insert.

5. The light emitting assembly of claim 1, wherein each of said light emitting packages further includes an enclosing wall enclosing said light emitting die, said enclosing wall includes a transparent dome-shaped portion covering said light emitting die, and a molded plastic portion extending from said dome-shaped portion, said heat dissipating member including a heat-sink slug that is embedded in said molded plastic portion of said enclosing wall and being bonded to said mesa of said heat sink.

6. The light emitting assembly of claim 1, wherein each of said light emitting packages further includes an enclosing wall enclosing said light emitting die, said enclosing wall includes a transparent dome-shaped portion covering said light emitting die, and a molded plastic portion extending from said dome-shaped portion, said heat dissipating member including a heat-sink slug that is embedded in said molded plastic portion of said enclosing wall, said heat dissipating member further including a ceramic layer disposed between and bonded to said heat-sink slug and said mesa of said heat sink.

7. The light emitting assembly of claim 1, wherein said conductive contact unit including includes a pair of conductive contacts printed on said trace-forming surface and coupled to said light emitting die, said heat dissipating member being bonded to said end face of said mesa.

8. The light emitting assembly of claim 1, wherein said plate-like base wall is formed with a plurality of fins.

9. The light emitting assembly of claim 1, further comprising at least one heat pipe, said plate-like base wall of said heat sink being formed with at least one retaining groove, said heat pipe having two end portions and an embedded portion that extends between said end portions and that is embedded in said retaining groove, said end portions of said heat pipe extending away from said plate-like base wall.

10. The light emitting assembly of claim 9, further comprising a cup-shaped reflector that has an end opening, said circuit board being fitted securely into said end opening to cover said end opening, said light emitting package being disposed in said reflector, said heat pipe being connected to said reflector so as to conduct heat from said heat sink to said reflector.

11. The light emitting assembly of claim 10, wherein said reflector has an outer wall formed with a plurality of fins.

12. The light emitting assembly of claim 9, wherein said embedded portion of said heat pipe is cylindrical in shape.

13. The light emitting assembly of claim 1, wherein each of said light emitting packages further includes an enclosing wall enclosing said light emitting die, said heat dissipating member including a heat-sink slug that is embedded in said enclosing wall and that is bonded to said mesa.

14. The light emitting assembly of claim 1, wherein each of said light emitting packages further includes an enclosing wall enclosing said light emitting die, said heat dissipating member including a heat-sink slug that is embedded in said enclosing wall, and a ceramic layer that is disposed between and bonded to said heat-sink slug and said mesa.

15. The light emitting assembly of claim 1, wherein said first metallic material is aluminum, and said second metallic material is selected from one of aluminum and copper.

* * * * *